(12) United States Patent
Kim et al.

(10) Patent No.: US 9,391,219 B2
(45) Date of Patent: Jul. 12, 2016

(54) PHOTOVOLTAIC APPARATUS

(71) Applicant: LG INNOTEK CO., LTD., Seoul (KR)

(72) Inventors: Jong Hyun Kim, Seoul (KR); Chan Yeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/395,464

(22) PCT Filed: Apr. 23, 2013

(86) PCT No.: PCT/KR2013/003463
§ 371 (c)(1),
(2) Date: Oct. 17, 2014

(87) PCT Pub. No.: WO2013/162254
PCT Pub. Date: Oct. 31, 2013

(65) Prior Publication Data
US 2015/0075581 A1    Mar. 19, 2015

(30) Foreign Application Priority Data

Apr. 23, 2012 (KR) .................. 10-2012-0041940

(51) Int. Cl.
*H01L 31/00* (2006.01)
*H01L 31/0352* (2006.01)
*H01L 31/0392* (2006.01)
*H01L 31/0463* (2014.01)
*H01L 31/05* (2014.01)
*H01L 31/0725* (2012.01)

(52) U.S. Cl.
CPC .. *H01L 31/035281* (2013.01); *H01L 31/03923* (2013.01); *H01L 31/0463* (2014.12); *H01L 31/0508* (2013.01); *H01L 31/0725* (2013.01); *Y02E 10/541* (2013.01)

(58) Field of Classification Search
CPC ............... H01L 31/0463; H01L 31/03923; H01L 31/035281; H01L 31/0508; H01L 31/0725; Y02E 10/541
See application file for complete search history.

(56) References Cited

U.S. PATENT DOCUMENTS

| 5,212,404 | A | 5/1993 | Awano |
| 6,239,474 | B1 | 5/2001 | Shinohara et al. |
| 6,706,963 | B2 * | 3/2004 | Gaudiana ............. H01G 9/2031 |
| | | | 136/244 |
| 8,816,192 | B1 * | 8/2014 | Walitzki ............ H01L 31/02366 |
| | | | 136/253 |

(Continued)

FOREIGN PATENT DOCUMENTS

| EP | 0905793 | A2 | 3/1999 |
| JP | 11-074562 | A | 3/1999 |

(Continued)

OTHER PUBLICATIONS

Search Report for International Application No. PCT/KR2013/003463.

*Primary Examiner* — Matthew Martin
(74) *Attorney, Agent, or Firm* — LRK Patent Law Firm

(57) ABSTRACT

A photovoltaic apparatus includes a support substrate; a back electrode layer on the support substrate; a light absorbing layer on the back electrode layer; and a front electrode layer on the light absorbing layer, wherein the support substrate comprises: a base layer; a first stepped portion on the base layer; and a second stepped portion disposed aside the first stepped portion on the base layer, and wherein the second stepped portion is thicker than the first stepped portion.

7 Claims, 4 Drawing Sheets

(56) References Cited

U.S. PATENT DOCUMENTS

2009/0084425 A1* 4/2009 Milshtein .............. H01L 31/046
136/244
2012/0186634 A1 7/2012 Jee et al.

FOREIGN PATENT DOCUMENTS

| JP | 2009-289817 A | 12/2009 |
|---|---|---|
| WO | 2010-114294 A2 | 10/2010 |

* cited by examiner

PHOTOVOLTAIC APPARATUS

TECHNICAL FIELD

The embodiment relates to a photovoltaic apparatus.

BACKGROUND ART

A method of fabricating a solar cell for solar light power generation is as follows. First, after preparing a substrate, a back electrode layer is formed on the substrate. Thereafter, a light absorbing layer, a buffer layer, and a high resistance buffer layer are sequentially formed on the back electrode layer. Various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer. The energy bandgap of the light absorbing layer is in the range of about 1 eV to 1.8 eV.

Then, a buffer layer including cadmium sulfide (CdS) is formed on the light absorbing layer through a sputtering process. The energy bandgap of the buffer layer may be in the range of about 2.2 eV to 2.4 eV. After that, a high resistance buffer layer including zinc oxide (ZnO) is formed on the buffer layer through the sputtering process. The energy bandgap of the high resistance buffer layer is in the range of about 3.1 eV to about 3.3 eV.

Then, a transparent electrode layer is formed on the high resistance buffer layer, and a transparent electrode layer is formed on the high resistance buffer layer. A material constituting the transparent electrode layer may include aluminum doped zinc oxide (AZO). The energy bandgap of the transparent electrode layer may be in the range of about 3.1 eV to about 3.3 eV.

Many studies and researches have been performed to improve photoelectric conversion efficiency by adjusting a bandgap energy in the light absorbing layer in the photovoltaic apparatus.

As described above, in order to convert the solar light into electrical energy, various photovoltaic apparatuses have been fabricated and used. One of the photovoltaic apparatuses is disclosed in Korean Unexamined Patent Publication No. 10-2008-0088744.

DISCLOSURE OF INVENTION

Technical Problem

The embodiment provides a photovoltaic apparatus having improved photoelectric conversion efficiency.

Solution to Problem

According to the embodiment, there is provided photovoltaic apparatus including: a support substrate; a back electrode layer on the support substrate; a light absorbing layer on the back electrode layer; and a front electrode layer on the light absorbing layer, wherein the support substrate comprises: a base layer; a first stepped portion on the base layer; and a second stepped portion disposed aside the first stepped portion on the base layer, and wherein the second stepped portion is thicker than the first stepped portion.

According to one embodiment, there is provided a photovoltaic apparatus including: a support substrate; and a plurality of solar cells on the support substrate, wherein the support substrate comprises: a base layer; and a plurality of stepped portions disposed on the base layer and having mutually different thicknesses, and wherein the solar cells are disposed corresponding to the stepped portions, respectively.

Advantageous Effects of Invention

According to the photovoltaic apparatus of the embodiment, stepped portions are formed in the support substrate. In addition, the solar cells are disposed on the stepped portions, respectively. Accordingly, a step difference is formed between the solar cells, and front electrodes and back electrodes of adjacent solar cells can be easily connected to each other. That is, the step difference between the front electrodes and the back electrodes of the adjacent solar cells can be reduced, and a connecting part can easily connect the front electrodes and the back electrodes of the adjacent solar cells to each other.

Accordingly, the photovoltaic apparatus of the embodiment can reduce a current moving path between the front electrodes and the back electrodes of the adjacent solar cells and can reduce resistance. Therefore, the photovoltaic apparatus of the embodiment can represent improved electric characteristics and improved photoelectric conversion efficiency.

Further, since the connecting part is provided without the step difference, short between the solar cells can be prevented. Accordingly, the photovoltaic apparatus of the embodiment may have a low failure rate.

MODE FOR INVENTION

Figure 1:
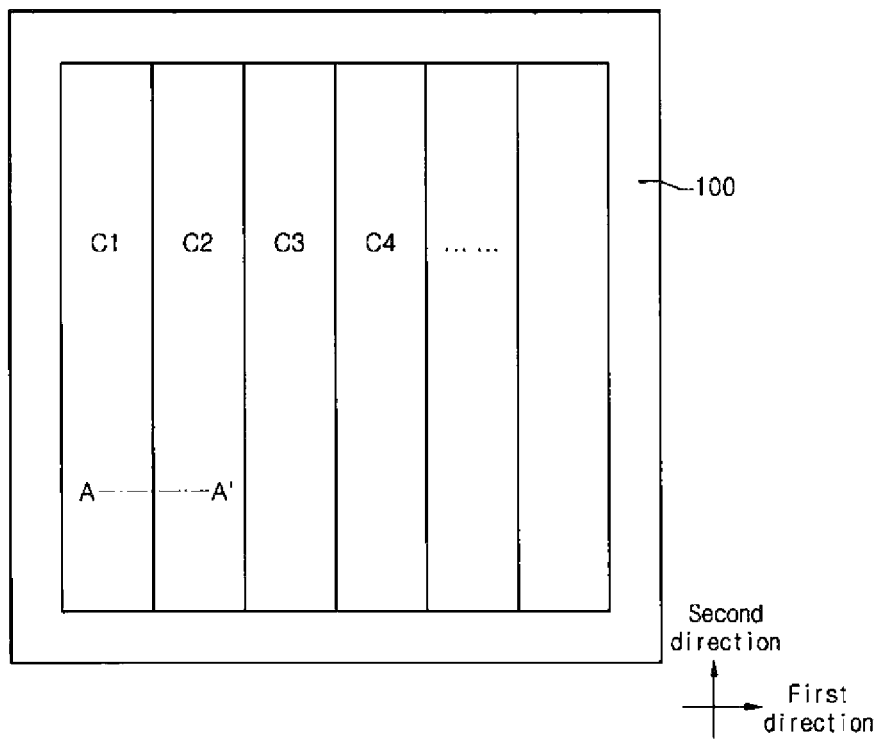
FIG. 1 is a plan view showing the photovoltaic apparatus according to the embodiment.

In the description of the embodiments, it will be understood that when a substrate, a film, an electrode, a recess, or a layer is referred to as being "on" or "under" another substrate, another film, another electrode, another recess, or another layer, it can be "directly" or "indirectly" on the other substrate, the other film, the other electrode, the other recess, or the layer, or one or more intervening layers may also be present. Such a position of the layer has been described with reference to the drawings. The size of the elements shown in the drawings may be exaggerated for the purpose of explanation and may not utterly reflect the actual size.

Figure 2:
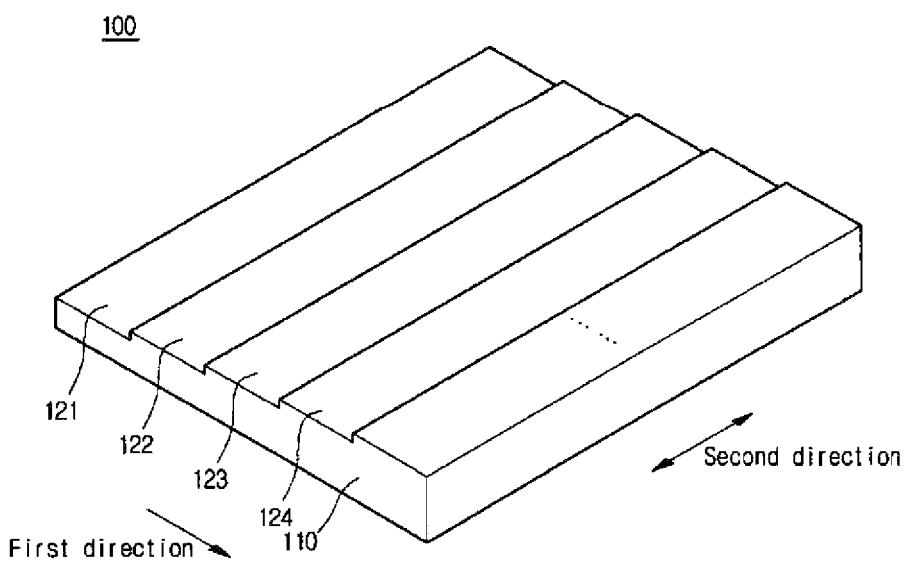
FIG. 2 is a perspective view showing a support substrate.
Figure 3:
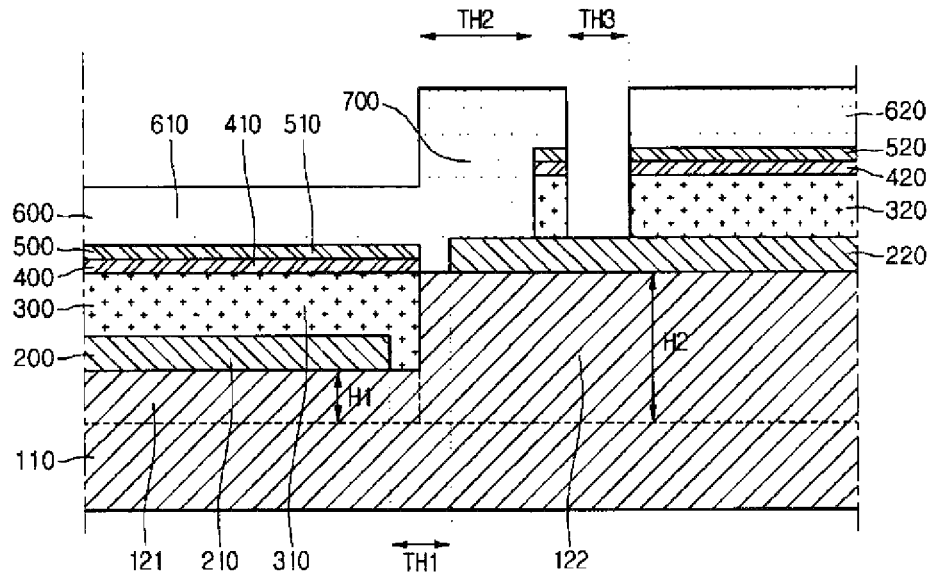
FIG. 3 is a sectional view taken along line A-A' of FIG. 1.

FIG. 1 is a plan view showing the photovoltaic apparatus according to the embodiment. FIG. 2 is a perspective view showing a support substrate. FIG. 3 is a sectional view taken along line A-A' of FIG. 1.

Referring to FIGS. 1 to 3, the photovoltaic apparatus according to the embodiment includes a support substrate 100, a back electrode layer 200, a light absorbing layer 300, a buffer layer 400, a high resistance layer 500, a front electrode layer 600, and a connecting part 700.

The support substrate 100 supports the back electrode layer 200, the light absorbing layer 300, the buffer layer 400, the high resistance layer 500, the front electrode layer 600, and connecting part 700.

The support substrate 100 may include an insulator. The support substrate 100 may be a glass substrate, a plastic substrate such as polymer or a metal substrate. Meanwhile, the support substrate 100 may include soda lime glass. The support substrate 100 may be transparent, flexible or rigid.

As shown in FIG. 2, a step difference is formed in a top surface of the support substrate 100. In detail, the support substrate 100 may have a stepped shape. That is, a thickness of the support substrate 100 may be gradually increased in a first direction. The support substrate 100 includes a base layer 110 and a plurality of stepped portions 121, 122, . . . , and N.

The base layer 110 supports the stepped portions 121, 122, . . . , and N. The base layer 110 may have a plate shape. The base layer 110 and the stepped portions 121, 122, . . . , and N may be integrally formed with each other. That is, an actual interface may not exist between the base layer 110 and the stepped portions 121, 122, . . . , and N.

In contrast, an interface may exist between the base layer 110 and the stepped portions 121, 122, . . . , and N. In detail, the base layer 110 and the stepped portions 121, 122, . . . , and N may include different materials. For example, the base layer 110 may include a glass, and the stepped portions 121, 122, . . . , and N may include a plastic material.

The stepped portions 121, 122, . . . , and N are disposed on the base layer 110. The stepped portions 121, 122, . . . , and N may have different thicknesses. That is, thicknesses of the stepped portions 121, 122, . . . , and N may be gradually increased in a first direction.

Further, the stepped portions 121, 122, . . . , and N may have a shape extending in a second direction vertical to the first direction. That is, when viewed from the top, the stepped portions 121, 122, . . . , and N may have a shape extending in the second direction. The stepped portions 121, 122, . . . , and N may have a width in the range of about 5 mm to about 10 mm.

The stepped portions 121, 122, . . . , and N may include a first stepped portion 211, a second stepped portion 122, a third stepped portion 123, and a fourth stepped portion 124.

The first stepped portion 121 is disposed on the base layer 110. The first stepped portion 121 may be disposed at the outer most portion of the base layer 110. The first stepped portion 121 has a first thickness H1. The first thickness H1 signifies a distance between a top surface of the base layer 110 and a top surface of the first stepped portion 121.

The second stepped portion 122 is disposed on the base layer 110. The second stepped portion 122 is disposed aside the first stepped portion 121. In detail, the second stepped portion 122 may be disposed next to the first stepped portion 121. The second stepped portion 122 has a second thickness H2. The second thickness H2 signifies a distance between the top surface of the base layer 110 and a top surface of the second stepped portion 122. The top surface of the second stepped portion 122 is disposed at a higher location than the top surface of the first stepped portion 121.

The second thickness H2 is greater than the first thickness H1. A difference between the first thickness H1 and the second thickness H2 is a step difference between the first stepped portion 121 and the second stepped portion 122. That is, the difference between the first thickness H1 and the second thickness H2 is the difference in the height between the top surface of the first stepped portion 121 and the top surface of the second stepped portion 122. The difference between the first thickness H1 and the second thickness H2 may be in the range of about 1 μm to about 5 μm. In detail, the difference between the first thickness H1 and the second thickness H2 may be in the range of about 2 μm to about 3 μm.

The third stepped portion 123 is disposed on the base layer 110. The third stepped portion 123 is disposed aside the second stepped portion 122. In detail, the third stepped portion 123 may be disposed next to the second stepped portion 122. The third stepped portion 123 has a third thickness. The third thickness H3 signifies a distance between the top surface of the base layer 110 and a top surface of the third stepped portion 123. The top surface of the third stepped portion 123 is disposed at a higher location than the top surface of the second stepped portion 122.

The third thickness is greater than the second thickness H2. A difference between the second thickness H2 and the third thickness is a step difference between the second stepped portion 122 and the third stepped portion 123. That is, the difference between the second thickness H2 and the third thickness is the difference in the height between the top surface of the second stepped portion 122 and the top surface of the third stepped portion 123. The difference between the second thickness H2 and the third thickness may be in the range of about 1 μm to about 5 μm. In detail, the difference between the second thickness H2 and the third thickness may be in the range of about 2 μm to about 3 μm.

The fourth stepped portion 124 is disposed on the base layer 110. The fourth stepped portion 124 is disposed aside the third stepped portion 123. In detail, the fourth stepped portion 124 may be disposed next to the third stepped portion 123. The fourth stepped portion 124 has a fourth thickness. The fourth thickness signifies a distance between the top surface of the base layer 110 and a top surface of the fourth stepped portion 124. The top surface of the fourth stepped portion 124 is disposed at a higher location than the top surface of the third stepped portion 123.

The fourth thickness is greater than the third thickness. A difference between the third thickness H3 and the fourth thickness is a step difference between the third stepped portion 123 and the fourth stepped portion 124. That is, the difference between the third thickness H3 and the fourth thickness is the difference in the height between the top surface of the second stepped portion 122 and the top surface of the third stepped portion 123. The difference between the third thickness and the fourth thickness may be in the range of about 1 μm to about 5 μm. In detail, the difference between the third thickness and the fourth thickness may be in the range of about 2 μm to about 3 μm.

The stepped portions 121, 122, . . . , and N may further include a fifth stepped portion, a sixth stepped portion, and a seventh stepped portion which are sequentially disposed in the first direction. The total number of the stepped portions 121, 122, . . . , and N disposed in this manner may be about 140. Meanwhile, the difference in the height between the lowest stepped portion and the highest stepped portion among the stepped portions 121, 122, . . . , and N may be in the range of about 280 μm to about 420 μm.

The back electrode layer 200 is disposed on the support substrate 100. In detail, the back electrode layer 200 may be disposed on the stepped portions 121, 122, . . . , and N. In detail, the back electrode layer 200 may be disposed on top surfaces of the stepped portions 121, 122, . . . m and N.

The back electrode layer 200 is a conductive layer. For example, a material used for the back electrode layer 200 may include metal such as molybdenum (Mo).

The back electrode layer 200 may include at least two layers. In this case, at least two layers may be formed by using the same metal or different metals.

The back electrode layer 200 is provided therein with a first through hole TH1. The first through hole TH1 is an open region to expose the top surface of the support substrate 100.

When viewed in a plan view, the first through hole TH1 may have a shape extending in one direction.

The first through hole TH1 is formed at a region where the stepped portions 121, 122, . . . , and N meet with each other. In detail, the first through hole TH1 is formed through the stepped portions 121, 122, . . . , and N adjacent to each other. For instance, the first through hole TH1 may be formed through a part of the first stepped portion 121 and a part of the second stepped portion 122. In addition, the first through hole TH1 may be formed through a part of the second stepped portion 122 and a part of the third stepped portion 123.

That is, the first through hole TH1 may be formed corresponding to a step difference defined by the stepped portions 121, 122, . . . , and N. In detail, the through hole TH1 may expose stepped parts formed by the stepped portions 121, 122, . . . , and N.

A width of the first through hole TH1 may be in the range of about 80 μm to 200 μm.

The back electrode layer 200 is divided into a plurality of back electrodes 210, 220, . . . , and N by the first through hole TH1. That is, the back electrodes 210, 220, . . . , and N are defined by the first through hole TH1. A first back electrode 210 and a second back electrode 220 among the back electrodes 210, 220, . . . , and N are illustrated in FIG. 3.

The back electrodes 210, 220, . . . , and N may correspond to the stepped portions 121, 122, . . . , and N, respectively. That is, a first back electrode 210 may correspond to the first stepped portion 121, and a second back electrode 220 may correspond to the second stepped portion. Further, the first back electrode 210 may be disposed on the top surface of the first stepped portion 121, and the second back electrode 220 may be disposed on the top surface of the second stepped portion 122. In the same manner, other back electrodes 210, 220, . . . , and N may be disposed on top surfaces of other stepped portions 121, 121, . . . , and N, respectively.

The back electrodes 210, 220, . . . , and N may be spaced apart from each other by the first through hole TH1. The back electrodes 210, 220, . . . , and N are provided in the form of a stripe.

Alternatively, the back electrodes 210, 220, . . . , and N may be provided in the form of a matrix. In this case, the first through hole TH1 may be formed in the form of a lattice when viewed in a plan view.

The light absorbing layer 300 is provided on the back electrode layer 200. Further, a material included in the light absorbing layer 300 is filled in the first through hole TH1.

The light absorbing layer 300 may include group compounds. For instance, the light absorbing layer 300 may include the Cu(In,Ga)Se2 (CIGS) crystal structure, the Cu(In)Se2 crystal structure, or the Cu(Ga)Se2 crystal structure.

The energy bandgap of the light absorbing layer 300 is in the range of about 1 eV to 1.8 eV.

The light absorbing layer 300 is provided therein with a second through hole TH2. The second through hole TH2 is formed through the light absorbing layer 300. Further, the second through hole TH2 is an open region to expose the top surface of the back electrode layer 200.

The second through hole TH2 may partially overlap with the first through hole TH1. That is, when viewed in a plan view, the second through hole TH2 may partially overlap with the first through hole TH1.

A width of the second through hole TH2 may be in the range of about 80 μm to 200 μm.

Further, the light absorbing layer 300 defines a plurality of light absorbing parts 310, 320, . . . , and N by the second through hole TH3. That is, the light absorbing layer 300 is divided into the light absorbing parts 310, 320, . . . , and N by the second through hole TH2.

The light absorbing parts 310, 320, . . . , and N may correspond to the stepped portions 121, 122, . . . , and N, respectively. That is, a first light absorbing part 310 may correspond to the first back electrode 210 and the first stepped portion 121, and a second light absorbing part 320 may correspond to the second back electrode 220 and the second stepped portion 122. In addition, a third light absorbing part may correspond to a third back electrode and a third stepped portion 123.

In addition, difference in the height between top surfaces of the light absorbing parts 310, 320, . . . , and N and top surfaces of the stepped portions 121, 122, . . . , and N may be in the range of about 0.5 μm to about 1 μm. For example, the difference in the height between a top surface of the first light absorbing part 310 and a top surface of the second stepped portion 122 may be in the range of about 0.01 μm to about 0.5 μm. Further, the difference in the height between a top surface of the second light absorbing part 320 and a top surface of the third stepped portion 123 may be in the range of about 0.01 μm to about 0.5 μm. In addition, the difference in the height between a top surface of the third light absorbing part 330 and a top surface of the fourth stepped portion 124 may be in the range of about 0.01 μm to about 0.5 μm.

The buffer layer 400 is provided on the light absorbing layer 300. The buffer layer 400 includes cadmium sulfide (CdS). The energy bandgap of the buffer layer 400 may be in the range of about 2.2 eV to about 2.4 eV.

The high resistance buffer layer 500 is provided on the buffer layer 400. The high resistance buffer layer 500 includes i-ZnO which is not doped with impurities. The energy bandgap of the high resistance buffer layer 500 may be in the range of about 3.1 eV to about 3.3 eV.

The buffer layer 400 is divided into a plurality of buffers 410, 420, . . . , N by the second through hole TH2, and the high resistance buffer layer 500 is divided into a plurality of high resistance buffers 510, 520, . . . , N by the second through hole TH2.

The front electrode layer 600 is provided on the high resistance buffer layer 500. The front electrode layer 600 is a transparent conductive layer. Further, resistance of the front electrode layer 600 is greater than resistance of the back electrode layer 200. For example, the resistance of the front electrode layer 600 may be about 10 to 200 times greater than the resistance of the back electrode layer 200. For example, a material used for the front electrode layer 600 may include an Al doped ZnO (AZO).

The front electrode layer 600 is provided therein with a third through hole TH3. The third through hole TH3 is an open region to expose the top surface of the back electrode layer 200. For example, a width of the third through hole TH3 may be in the range of about 80 μm to about 200 μm.

The third through hole TH3 is formed adjacent to the second through hole TH2. In detail, the third through hole TH3 is disposed aside the second through hole TH2. That is, when viewed in a plan view, the third through hole TH3 is disposed aside the second through hole TH2 in parallel.

The front electrode layer 600 is divided into a plurality of front electrodes 610, 620, . . . , and N by the third through hole TH3. That is, the front electrodes 610, 620, . . . , N are defined by the third through hole TH3.

The front electrodes 610, 620, . . . , and N may have shapes corresponding to the back electrodes 210, 220, . . . , and N, respectively. Further, the front electrodes 610, 620, . . . , and N may correspond to the stepped portions 121, 122, . . . , N, respectively. That is, the front electrodes 610, 620, . . . , and N are provided in the form of a stripe. Alternatively, the front electrodes 610, 620, . . . , and N may be provided in the form of a matrix.

In addition, a plurality of solar cells C1, C2. . . , and CN are defined by the third through hole TH3. In detail, the solar cells C1, C2. . . , and CN are defined by the second through hole TH2 and the third through hole TH3. That is, the photovoltaic apparatus according to the embodiment is divided into the solar cells C1, C2, . . . , and CN by the second through hole TH2 and the third through hole TH3.

That is, the photovoltaic apparatus according to the embodiment includes the solar cells C1, C2, . . . , and CN. The solar cells C1, C2, . . . , and CN are disposed corresponding to the stepped portions 121, 122, . . . , and N. In addition, the solar cells C1, C2, . . . , and CN may have a shape substantially the same as a shape of the stepped portions 121, 122, . . . , and N when viewed from the top. In detail, the solar cells C1, C2, . . . , and CN are disposed on top surfaces of the stepped portions 121, 122, . . . , and N, respectively. For example, the photovoltaic apparatus according to the embodiment includes a first solar cell C1, a second solar cell C2, a third solar cell C3, and a fourth solar cell.

The first solar cell C1 corresponds to the first stepped portion 121. The first solar cell C1 is disposed on a top surface of the first stepped portion 121. The first solar cell C1 may be disposed on only the top surface of the first stepped portion 121. That is, the first solar cell C1 may be disposed over the whole top surface of the first stepped portion 121.

The second solar cell C2 corresponds to the second stepped portion 122. The second solar cell C2 is disposed on a top surface of the second stepped portion 122. The second solar cell C2 may be disposed on only the top surface of the second stepped portion 122. That is, the second solar cell C2 may be disposed on an entire top surface of the second stepped portion 122.

The third solar cell C3 corresponds to the third stepped portion 123. The third solar cell C3 is disposed on a top surface of the third stepped portion 123. The third solar cell C3 may be disposed on only the top surface of the third stepped portion 123. That is, the third solar cell C3 may be disposed on an entire top surface of the third stepped portion 123.

The fourth solar cell C4 corresponds to the fourth stepped portion 124. The fourth solar cell C4 is disposed on a top surface of the fourth stepped portion 124. The fourth solar cell C4 may be disposed on only the top surface of the fourth stepped portion 124. That is, the fourth solar cell C4 may be disposed on an entire top surface of the fourth stepped portion 124.

The solar cells C1, C2, . . . , and CN are disposed while forming step differences therebetween. That is, the step differences are formed between the top surfaces of the stepped portions 121, 122, . . . , and N, so the step differences are formed between the solar cells C1, C2, . . . , and CN. That is, the solar cells C1, C2 . . . , and CN are aligned on different planes.

Each of the solar cells C1, C2, . . . , and CN includes a back electrode, a light absorbing part, a buffer, a high resistance buffer, and a front electrode. For example, the first solar cell C1 includes the first back electrode 210, the first light absorbing part 310, the first buffer 410, the first high resistance buffer 510, and the first front electrode 610. Further, the second solar cell C2 includes the second back electrode 220, the second light absorbing part 320, the second buffer 420, the second high resistance buffer 520, and the second front electrode 620.

The first back electrode 210 is disposed on the support substrate 100, and the first light absorbing part 310, the first buffer 410, and the first high resistance buffer 510 may be sequentially laminated on the first back electrode 210. The first front electrode 610 is disposed on the first high resistance buffer 510.

That is, the first back electrode 210 faces the first front electrode 610 while being interposed the first light absorbing part 310 therebetween.

Although not shown in drawings, the first light absorbing part 310 and the first front electrode 610 cover the first back electrode 210 by partially exposing the top surface of the first back electrode 210.

Further, the second back electrode 220 is spaced apart from the first back electrode 210 on the support substrate 100. The second light absorbing part 320 is spaced apart from the first light absorbing part 310 on the second back electrode 220. The second front electrode 620 is spaced apart from the first front electrode 610 on the second resistance buffer 520.

The second light absorbing part 320 and the second front electrode 620 cover the second back electrode 220 by partially exposing the top surface of the second back electrode 220.

Likewise, the third solar cell C3 includes the third back electrode, the third light absorbing part, the third buffer, the third high resistance buffer, and the third front electrode. In addition, the fourth solar cell includes the fourth back electrode, the fourth light absorbing part, the fourth buffer, the high resistance buffer, and the fourth front electrode.

The first back electrode 210, the second back electrode 220, the third back electrode, and the fourth back electrode are aligned on different planes. Further, the first light absorbing part 310, the second light absorbing part 320, the third light absorbing part, and the fourth light absorbing part are aligned on different planes. Moreover, the first front electrode 610, the second front electrode 620, the third front electrode, and the fourth front electrode are aligned on different planes.

In this case, the first front electrode 610 may be aligned on the substantially same plane with the second back electrode 220. That is, step difference is rarely formed between the first front electrode 610 and the second back electrode 220. For example, the difference in the height between a bottom surface of the first front electrode 610 and a bottom surface of the second back electrode 220 may be about 0.5 µm or less. In detail, the difference in the height between the bottom surface of the first front electrode 610 and the bottom surface of the second back electrode 220 may be in the range of about 0.01 µm to about 0.5 µm. Further, the difference in the height between a top surface of the first light absorbing part 310 and a top surface of the second stepped portion 122 may be about 0.5 µm or less. In detail, the difference in the height between the top surface of the first light absorbing part 310 and the top surface of the second stepped portion 122 may be in the range of about 0.01 µm to about 0.5 µm.

Likewise, the second front electrode 620 may be aligned on substantially the same plane as the third back electrode. That is, a step difference between the second front electrode 620 and the third back electrode may be substantially the same as a step difference between the first front electrode 610 and the second back electrode 220. Further, the third front electrode may be aligned on substantially the same plane as the fourth back electrode. That is, a step difference between the third front electrode and the fourth back electrode may be substantially the same as a step difference between the first front electrode 610 and the second back electrode 220.

The connecting part 700 is disposed at an inner side of the second through hole TH2.

The connecting part 700 extends from the front electrode layer 600 to a lateral direction, and directly makes contact with the back electrode layer 200. For example, the connecting part 700 extends from the first front electrode 610 to the lateral direction and directly makes contact with the second back electrode 220.

Accordingly, the connecting part 700 connects front electrodes and back electrodes included in adjacent solar cells the solar cells C1, C2, . . . , and CN to each other. For example, the connecting part 700 connects the first front electrode 610 to the second back electrode 220. Further, the connecting part 700 connects the second front electrode 620 to the third back electrode.

The connecting part 700 may be integrally formed with the front electrodes 610, 620, . . . , and N. That is, a material used for the connecting part 700 is the same as a material used for the front electrode layer 600.

The connecting part 700 directly makes contact with a side and a top surface of the back electrode. In addition, the connecting part 700 may directly make contact with only a side or a top surface of the back electrode.

As described above, in the photovoltaic apparatus according to the embodiment, the step difference is formed on the support substrate 100. The solar cells C1, C2, . . . , and CN, are disposed at the stepped portions 121, 122, . . . , and N, respectively. Accordingly, the solar cells C1, C2, . . . , and CN are formed while forming the step difference therebetween, and front electrode and the back electrodes of adjacent solar cells C1, C2, . . . , and CN may be easily connected to each other. That is, the step difference between the front electrodes and the back electrodes of the adjacent solar cells C1, C2, . . . , and CN is reduced, and the connecting part 700 can easily connect the front electrodes and the back electrodes of the adjacent solar cells C1, C2, . . . , and CN to each other.

Accordingly, the photovoltaic apparatus of the embodiment can reduce a current moving path between the front electrodes and the back electrodes of the adjacent solar cells C1, C2, . . . , and CN and can reduce resistance. Therefore, the photovoltaic apparatus of the embodiment can represent improved electric characteristics and improved photoelectric conversion efficiency.

Further, since the connecting part is provided without the step difference, short between the solar cells C1, C2, . . . , and CN can be prevented. Accordingly, the photovoltaic apparatus of the embodiment may have a low failure rate.

Further, the first through hole TH1 is formed between the stepped portions 121, 122, . . . , and N. Accordingly, the back electrodes 210, 220, . . . , and N may be aligned on different planes. Therefore, the back electrodes 210, 220, . . . , and N may be efficiently insulated from each other. Although a width of the first through hole TH1 is reduced, short between the back electrodes 210, 220, . . . , and N may be efficiently prevented. As a result, the photovoltaic apparatus according to the embodiment can reduce the failure caused by the short. In addition, the photovoltaic apparatus according to the embodiment can increase an effective area for solar light generation. Thus, the embodiment provides a photovoltaic apparatus having improved photoelectric conversion efficiency.

FIGS. 4 to 9 are sectional views showing a method of fabricating the photovoltaic apparatus according to the embodiment. The method of fabricating the photovoltaic apparatus according to the embodiment will be described by making reference to the above description of the photovoltaic apparatus.

Figure 4:
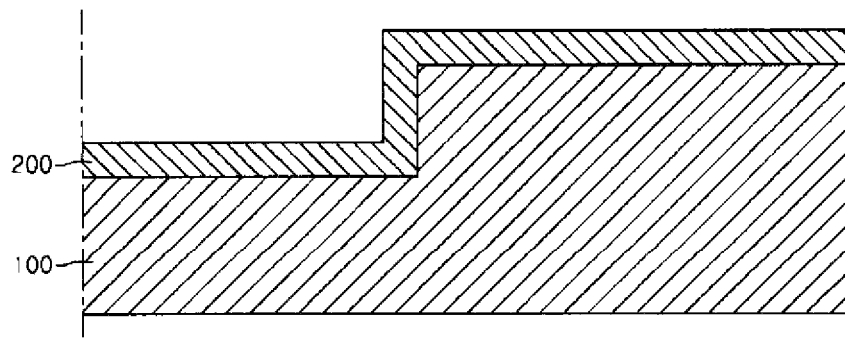
FIGS. 4 to 9 are sectional views showing a method of fabricating the photovoltaic apparatus according to the embodiment.

Referring to FIG. 4, a back electrode layer 200 is formed on a support substrate 100.

The support substrate 100 is incorporated in the description of the photovoltaic apparatus. The support substrate 100 includes a base layer 110 and a plurality of stepped portions. The base layer 110 and the stepped portions 121, 122, . . . , and N may be integrally formed with each other.

The back electrode layer 200 may be formed by depositing a metal such as molybdenum on the support substrate 100. The back electrode layer 200 is formed on top surface of the stepped portions 121, 122, . . . , and N. Further, the back electrode layer 200 may be formed one sides of the stepped portions 121, 122, . . . , and N. The back electrode layer 200 may be formed by a sputtering process.

Figure 5:
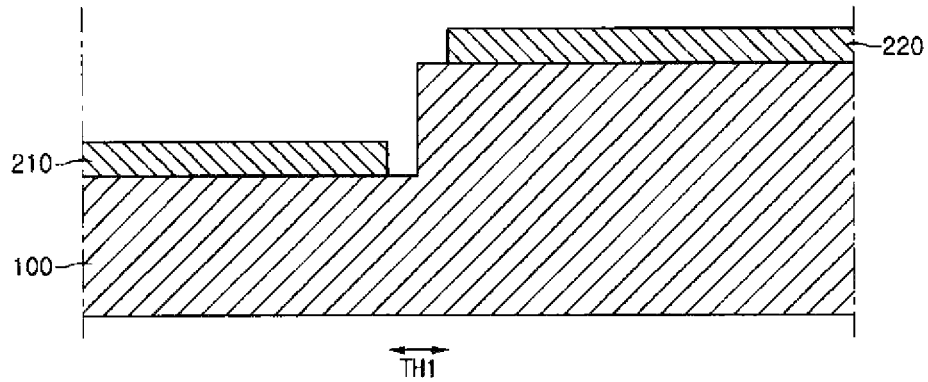

Referring to FIG. 5, a first through hole TH1 is formed by patterning the back electrode layer 200. Accordingly, a plurality of back electrodes 210, 220, . . . , and N are formed on the support substrate 100. The back electrode layer 200 is patterned by a laser.

In this case, the first through TH1 may be formed corresponding to a region where the stepped portions 121, 122, . . . , and N meet with each other. That is, the first through hole TH1 may be formed over two adjacent stepped portions 121, 122, . . . , and N.

The first through hole TH1 exposes the top surface of the support substrate 100, and may have a width in the range of about 80 µm to about 200 µm.

An additional layer such as a diffusion prevention layer may be interposed between the support substrate 100 and the back electrode layer 200. In this case, the first through hole TH1 exposes a top surface of the additional layer.

Figure 6:
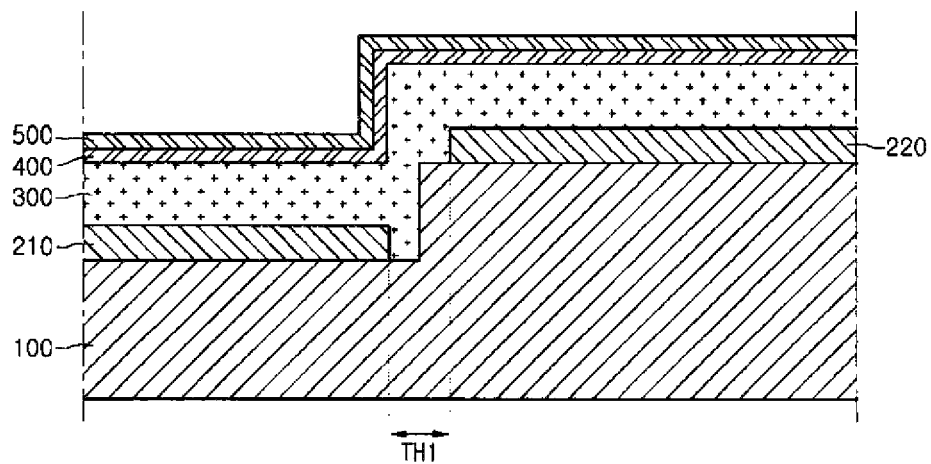

Referring to FIG. 6, a light absorbing layer 300 is formed on the back electrode layer 200.

The light absorbing layer 300 can be formed through a sputtering scheme or an evaporation scheme.

For instance, various schemes, such as a scheme of forming a Cu(In,Ga)Se2 (CIGS) based-light absorbing layer by simultaneously or separately evaporating Cu, In, Ga, and Se and a scheme of performing a selenization process after a metallic precursor film has been formed, have been extensively used in order to form the light absorbing layer 300.

In detail, the metal precursor layer is formed on the back electrode layer 200 by performing the sputtering process using a Cu target, an In target, and a Ga target.

Then, the selenization process is performed to form the CIGS-based light absorbing layer.

In addition, the sputtering process using the Cu target, the In target, and the Ga target and the selenization process can be simultaneously performed.

Moreover, the sputtering process or the selenization process is performed using only the Cu target and the In target or only the Cu target and the Ga target to form CIS-based or CIG-based light absorbing layer.

Next, CdS is depositing on the light absorbing layer 300 through the sputtering process or the chemical bath deposition (CBD), and the buffer layer 400 is formed.

After that, zinc oxide is deposed on the buffer layer 400 through the sputtering process, and the high resistance buffer layer 500 is formed.

Figure 7:
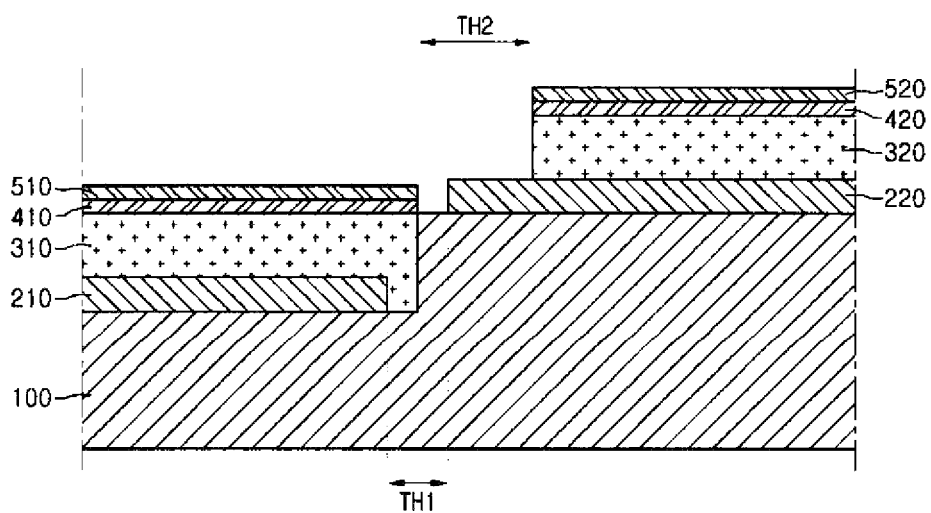

Referring to FIG. 7, a second through hole TH2 is formed by partially removing the light absorbing layer 300, the buffer 400, and the high resistance buffer layer 500.

The second through hole TH2 may be formed by a mechanical device, such as a tip, or a laser device.

For example, the light absorbing layer 300 and the buffer layer 400 may be patterned by a tip having a width in the range of about 40 µm to about 180 µm. Further, the second through hole TH2 may be formed by a laser having a wavelength in the range of about 200 nm to 600 nm.

In this case, a width of the second through hole TH2 may be in the range of about 100 µm to about 200 µm. Moreover, the second through hole TH2 is formed to partially expose the top surface of the back electrode layer 200.

Figure 8:
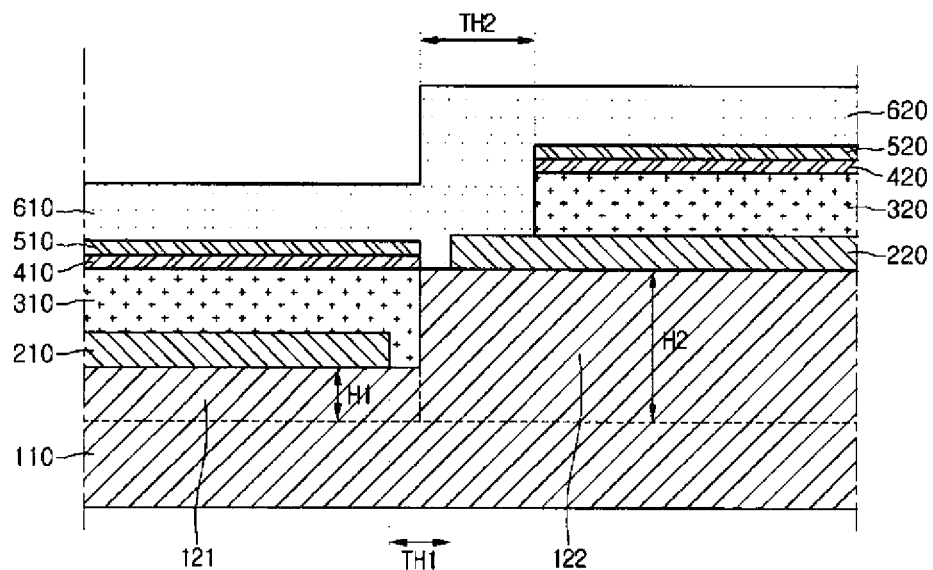

Referring to FIG. 8, a front electrode layer 600 is formed on the high resistance buffer layer 500. In this case, a material constituting the front electrode layer 600 is filled in an inner side of the second through groove TH2.

A transparent conductive material is laminated on the high resistance buffer layer 500 to form the front electrode layer 600. The transparent conductive material is fully filled in the second through groove TH2. For example, the transparent conductive material may include Al doped ZnO (AZO).

Accordingly, a connecting part 70 extending from the front electrode layer 600 and directly connected to the back electrode layer 200 is provided at an inner side of the second through hole TH2.

Figure 9:
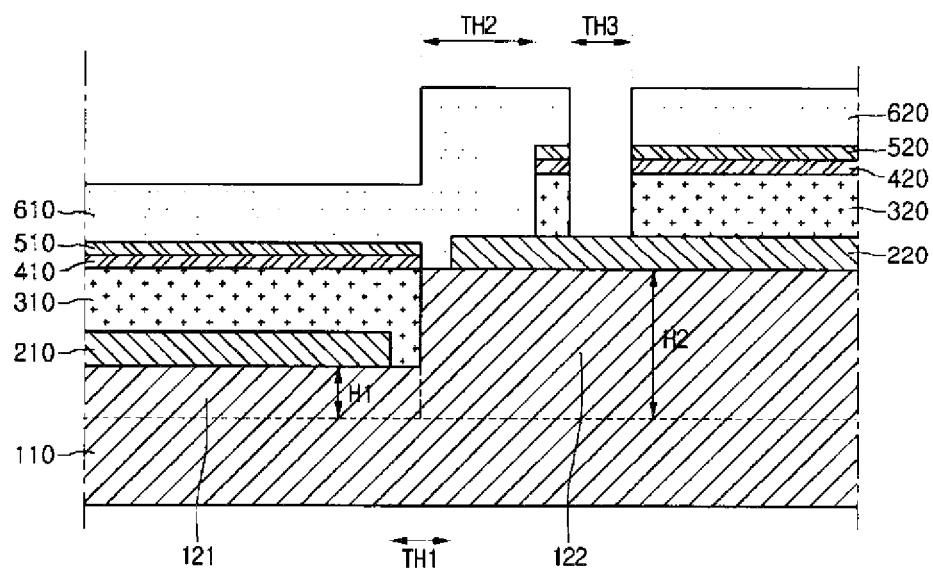

Referring to FIG. 9, a third through hole TH3 is formed by partially removing the front electrode layer 600. That is, a plurality of front electrodes 610, 620, . . . , and N and a plurality of solar cells C1, C2, . . . , and CN are defined by patterning the front electrode layer 600.

A width of the third through hole TH3 may be in the range of about 80 µm to about 200 µm.

In this manner, according to the method of fabricating the photovoltaic apparatus of the embodiment, the photovoltaic apparatus having improved photoelectric conversion efficiency can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A photovoltaic apparatus comprising:
a support substrate; and
a plurality of solar cells on the support substrate,
wherein the support substrate comprises:
a base layer; and
a plurality of stepped portions disposed on the base layer and having mutually different thicknesses,
wherein the solar cells are disposed corresponding to the stepped portions, respectively,
wherein the stepped portions comprise:
a first stepped portion on the base layer; and
a second stepped portion disposed aside the first stepped portion and thicker than the first stepped portion,
wherein the solar cells comprise:
a first solar cell on a top surface of the first stepped portion; and
a second solar cell on a top surface of the second stepped portion,
wherein the first solar cell comprises:
a first back electrode on the first stepped portion;
a first light absorbing part on the first back electrode; and
a first front electrode on the first light absorbing part,
wherein the second solar cell comprises:
a second back electrode on the second stepped portion;
a second light absorbing part on the second back electrode; and
a second front electrode on the second light absorbing part,
wherein the first back electrode and the second back electrode are aligned on mutually different planes, the first light absorbing part and the second light absorbing part are aligned on mutually different planes, and the first front electrode and the second front electrode are aligned on mutually different planes,
wherein the first front electrode is disposed on the first and second stepped portions, and
wherein the first front electrode is connected with the second back electrode on the second stepped portion.

2. The photovoltaic apparatus of claim 1, wherein the base layer and the stepped portions are integrally formed with each other.

3. The photovoltaic apparatus of claim 1, further comprising a connecting part extending from the first front electrode and connected to the second back electrode.

4. The photovoltaic apparatus of claim 3, wherein a difference in a height between a top surface of the first light absorbing part and a top surface of the second stepped portion is in a range of about 0.01 µm to about 5 µm.

5. The photovoltaic apparatus of claim 1, wherein the base layer and the stepped portions include different materials.

6. The photovoltaic apparatus of claim 1, wherein the difference in the height between the lowest stepped portion and the highest stepped portion among the stepped portions are in the range of 280 µm to 420 µm.

7. The photovoltaic apparatus of claim 1, wherein the support substrate has a stepped shape.

* * * * *